United States Patent
Hsiung et al.

(10) Patent No.: US 9,224,881 B2
(45) Date of Patent: Dec. 29, 2015

(54) LAYERS FOR INCREASING PERFORMANCE IN IMAGE SENSORS

(71) Applicant: OmniVision Technologies, Inc., Santa Clara, CA (US)

(72) Inventors: Chih-Wei Hsiung, Zhubei (TW); Oray Orkun Cellek, Mountain View, CA (US); Gang Chen, San Jose, CA (US); Duli Mao, Sunnyvale, CA (US); Vincent Venezia, Los Gatos, CA (US); Hsin-Chih Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/856,993

(22) Filed: Apr. 4, 2013

(65) Prior Publication Data

US 2014/0299956 A1    Oct. 9, 2014

(51) Int. Cl.
*H01L 21/02* (2006.01)
*H01L 31/0216* (2014.01)
*H01L 27/146* (2006.01)

(52) U.S. Cl.
CPC ...... *H01L 31/02161* (2013.01); *H01L 27/1462* (2013.01); *H01L 27/1464* (2013.01)

(58) Field of Classification Search
CPC ............ H01L 27/1464; H01L 27/1462; H01L 27/14627; H01L 27/14685; H01L 27/14609; H01L 27/14625; H01L 27/1463; H01L 27/14621; H01L 27/14623; H01L 27/14629; H01L 27/14643; H01L 27/14645; H01L 27/148
USPC ............. 257/E31.073, 439, E27.13, E27.148, 257/E31.052, E31.075, E31.078, E31.119, 257/E31.121, E31.122, 291, 293, 294, 435, 257/443, 447, 448; 438/57, 59, 60, 70, 72, 438/75, 292, E31.053
See application file for complete search history.

(56) References Cited

U.S. PATENT DOCUMENTS 7,939,359 B2    5/2011   Ohgishi
8,034,649 B2    10/2011  Oshiyama et al.
(Continued)

FOREIGN PATENT DOCUMENTS

WO    WO 2012/061152 A2    5/2012

OTHER PUBLICATIONS

KR Patent Application No. 2014-0040569—Korean Office Action and Search Report, with English Translation, mailed May 11, 2015 (12 pages).
(Continued)

*Primary Examiner* — Su C Kim
*Assistant Examiner* — Junaiden Mirsalahuddin
(74) *Attorney, Agent, or Firm* — Blakely Sokoloff Taylor & Zafman LLP

(57) ABSTRACT

An imaging device includes a semiconductor substrate having a photosensitive element for accumulating charge in response to incident image light. The semiconductor substrate includes a light-receiving surface positioned to receive the image light. The imaging device also includes a negative charge layer and a charge sinking layer. The negative charge layer is disposed proximate to the light-receiving surface of the semiconductor substrate to induce holes in an accumulation zone in the semiconductor substrate along the light-receiving surface. The charge sinking layer is disposed proximate to the negative charge layer and is configured to conserve or increase an amount of negative charge in the negative charge layer. The negative charge layer is disposed between the semiconductor substrate and the charge sinking layer.

5 Claims, 13 Drawing Sheets

(56) References Cited

U.S. PATENT DOCUMENTS

| | | | |
|---|---|---|---|
| 2009/0209056 A1* | 8/2009 | Hiyama et al. | 438/57 |
| 2009/0230496 A1 | 9/2009 | Takimoto | |
| 2010/0108864 A1 | 5/2010 | Ohta et al. | |
| 2011/0025872 A1 | 2/2011 | Oshiyama et al. | |
| 2011/0031376 A1 | 2/2011 | Oshiyama et al. | |
| 2011/0101482 A1* | 5/2011 | Meynants | 257/432 |
| 2011/0164159 A1 | 7/2011 | Ohgishi | |
| 2013/0063636 A1* | 3/2013 | Ohgishi | 348/294 |
| 2013/0099232 A1* | 4/2013 | Cho et al. | 257/43 |
| 2013/0285181 A1* | 10/2013 | Lin et al. | 257/432 |
| 2013/0320479 A1* | 12/2013 | Ahn et al. | 257/460 |
| 2014/0117485 A1* | 5/2014 | Rhodes et al. | 257/443 |

OTHER PUBLICATIONS

JP Patent Application No. 2014-076629—Japanese Office Action and Search Report, with English Translation, mailed Apr. 1, 2015 (5 pages).

EP 14163445.1—Extended European Search Report, issued Jul. 3, 2014 (8 pages).

TW Patent Application No. 102139871—Taiwanese Office Action and Search Report, with English Translation, mailed Jun. 16, 2015 (11 pages).

Janesick, J. et al., "Quantum Efficiency Model for the CCD Flash Gate," Jet Propulsion Laboratory, Pasadena, California, IEEE, 1986, pp. 350-352.

Lau, W. S. et al., "Defect states responsible for leakage current in $Ta_2O_5$ films on Si due to Si contamination from the substrate," Journal of Applied Physics, vol. 79, No. 11, Jun. 1, 1996, pp. 8841-8843.

Zhu, W. J. et al., "Current Transport in Metal/Hafnium Oxide/Silicon Structure," IEEE Electron Device Letters, vol. 23, No. 2, Feb. 2002, pp. 97-99.

Kerber, A. et al., "Origin of the Threshold Voltage Instability in SiO/HfO Dual Layer Gate Dielectrics," IEEE Electron Device Letters, vol. 24, No. 2, Feb. 2003, pp. 87-89.

Maikap, S. et al., "Charge trapping characteristics of atomic-layer-deposited $HfO_2$ films with $Al_2O_3$ as a blocking oxide for high-density non-volatile memory device applications," Semiconductor Science and Technology, vol. 22, 2007, pp. 884-889, IOP Publishing, UK.

Tachibana, T. et al., "Material Research on High-Quality Passivation Layers with Controlled Fixed Charge for Crystalline Silicon Solar Cells," Japanese Journal of Applied Physics, vol. 50, 2011, 4 pages, The Japan Society of Applied Physics.

Boher, P. et al., "Characterization of High-k Dielectrics ($HfO_2$, $Al_2O_3$, HfAlOx) with VUV Spectroscopic Ellipsometer (VUV-SE) and Grazing X-ray Reflectometer(GXR)," PowerPoint slides presented at AVS North California Chapter, SOPRA Inc., Apr. 16, 2013, 21 pages.

Tsai, K. et al., "High-Reliability $Ta_2O_5$ Metal—Insulator—Metal Capacitors with Cu-Based Electrodes," Journal of The Electrochemical Society, 153 (5), pp. G492-G497, 2006, The Electrochemical Society.

Nishioka, Y. et al., "Ultra-Thin $Ta_2O_5$ Dielectric Film for High-speed Bipolar Memories," IEEE Transactions on Electron Devices, vol. ED-34, No. 9, Sep. 1987, pp. 1957-1962.

\* cited by examiner

LAYERS FOR INCREASING PERFORMANCE IN IMAGE SENSORS

TECHNICAL FIELD

This disclosure relates generally to image sensors, and in particular but not exclusively, relates to backside illuminated image sensors.

BACKGROUND INFORMATION

Image sensors are widely used in digital still cameras, cellular phones, security cameras, as well as in, medical, automobile, and other applications. Complementary metal-oxide-semiconductor ("CMOS") technology is used to manufacture lower cost image sensors on silicon substrates. In a large number of image sensors, the image sensor commonly includes hundreds, thousand or even millions of light sensor cells or pixels.

Backside illuminated ("BSI") technology is often used in image sensors to increase the amount of image light that becomes incident on photosensitive elements in pixels of the image sensor. When BSI technology is used, backside accumulation helps create an electric field that directs photoelectrons (generated by incident image light) to a frontside of the image sensor where they can be collected and measured. Without accumulation on the backside the semiconductor substrate, diffusion of the electrons to the back surface may result in loss by recombination, which may degrade the sensitivity of the image sensor. Advantageously, accumulation on the backside of the semiconductor substrate can reduce or impede "dark current" generated from the semiconductor substrate's interface with another layer (e.g. silicon dioxide insulation layer). Reducing "dark current" will improve the signal-to-noise ratio of the image sensor, which importantly, improves the sensitivity of the image sensor. Given that accumulation on the backside of the semiconductor substrate is beneficial, the image sensor industry seeks to generate backside accumulation that will give image sensors improved performance.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an image sensor and an imaging system are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
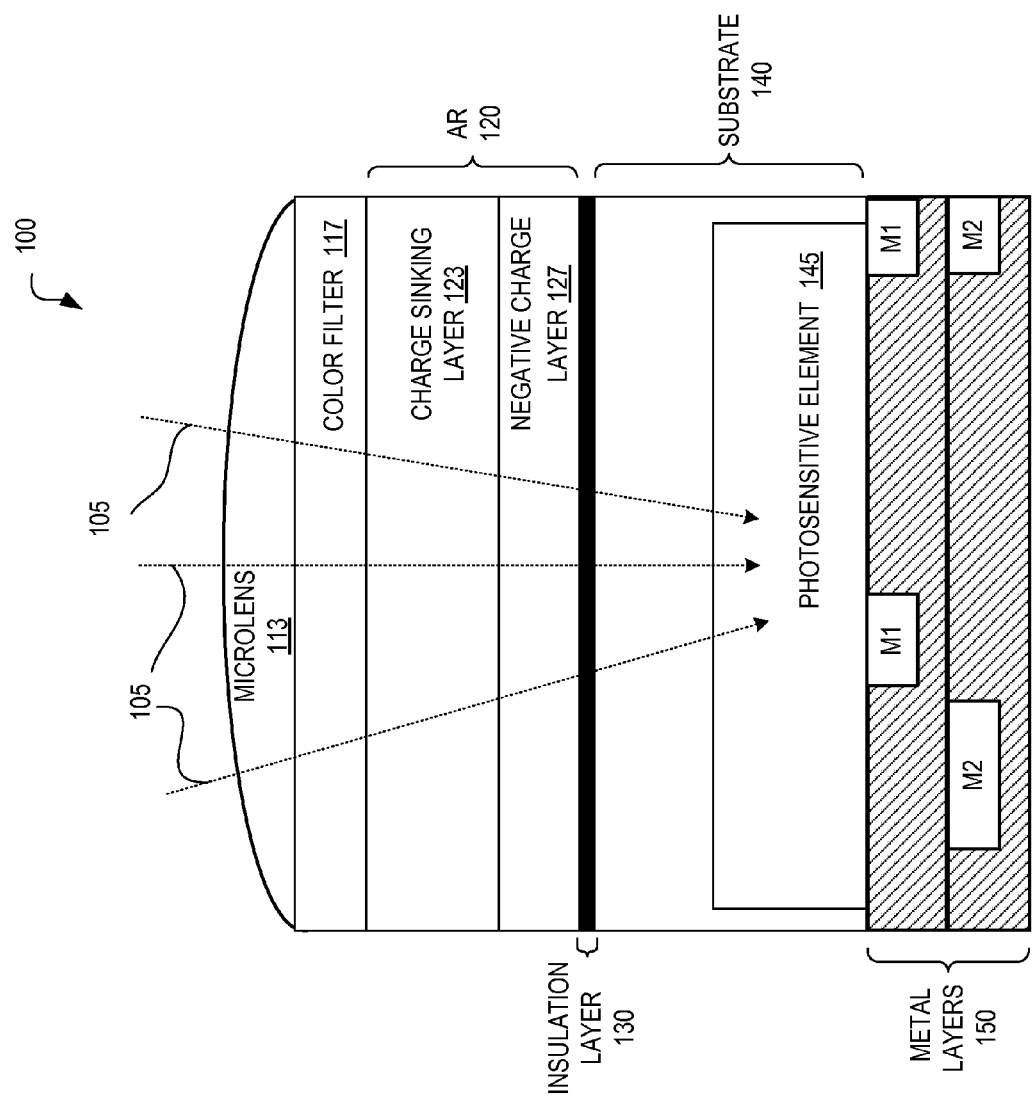
FIG. 1 illustrates one example of a pixel of a backside illuminated image sensor having a negative charge layer and a charge sinking layer, in accordance with an embodiment of the disclosure.

FIG. 1 illustrates pixel 100 of a backside illuminated ("BSI") image sensor having a negative charge layer 127, in accordance with an embodiment of the disclosure. Pixel 100 includes microlens 113, color filter 117, anti-reflection element 120, insulation layer 130, semiconductor substrate 140, and metal layers 150. Anti-reflection element 120 includes a charge sinking layer 123 and a negative charge layer 127.

Negative charge layer 127 retains negative fixed electric charge and is negatively charged. Charge sinking layer 123 functions to sink positive charge from negative charge layer 127. Sinking the positive charge from negative charge layer 127 increases or retains the negative charge of negative charge layer 127. In order to "sink" positive charge from negative charge layer 127, charge sinking layer 123 may be positively charged (i.e. it retains positive fixed electric charge). In some cases, the charge sinking layer may actually supply electrons to the negative charge layer.

As will be explained in more detail, negative charge layer 127 is disposed proximate to semiconductor substrate 140 to induce holes in an accumulation zone in the semiconductor substrate. Charge sinking layer 123 holds the negative charge in the negative charge layer 127 in place, which in turn enables negative charge layer 127 to hold the holes in the accumulation zone in place at an acceptable hole density.

The combination of charge sinking layer 123 and negative charge layer 127 is referred to as an anti-reflection element 120 because the thicknesses of the layers 123 and 127 are sized to be substantially anti-reflective so that image light 105 travels to photosensitive element 145 without being reflected at the interfaces of layers 123 and 127. The thicknesses of layers 123 and 127 may be sized based on an index of refraction of each layer, while also taking into consideration the wavelength of image light 105. Additional consideration will be taken in sizing the thickness of charge sinking layer 123 and negative charge layer 127 for anti-reflection in embodiments where there are more layers between color filter 117 and insulation layer 130 than are shown in FIG. 1.

Semiconductor substrate 140 includes a photosensitive element 145 for accumulating charge in response to incident image light 105. Metal layers 150 may include metal interconnects configured to facilitate readout of pixel 100. For example, metal layer 150 may include an electrode of a transfer gate (not shown) for transferring electrons (generated by photons from image light 105) in photosensitive element 145 to a floating diffusion region. The floating diffusion region (not shown) may also be located in semiconductor substrate 140.

In the illustrated embodiment, image light 105 propagates along an optical path that encounters microlens 113, color filter 117, charge sinking layer 123, negative charge layer 127, insulation layer 130, and semiconductor substrate 145, in that order. In other embodiments, some of the layers may be rearranged or have layers added or subtracted. In some embodiments, a color filter 117 may not be included. When image light 105 encounters microlens 113 along the optical path, microlens 113 focuses or condenses the image light (for optical efficiency) to direct image light 105 to photosensitive element 145. During an integration period (also referred to as an exposure or accumulation period), image light 105 is incident on photosensitive element 145 and photosensitive element 145 generates an electrical signal (photo-generated charge) in response to the incident light. The electrical signal is held in photosensitive element 145. At this stage, a transfer gate (not shown) may be off. When the integration period is over, the transfer gate may turn on and, allowing the electrons from photosensitive element 145 to transfer into the floating diffusion region, which will later be readout by readout circuitry of an image sensor.

FIGS. 2-11 illustrate examples of layers that may be disposed between microlens 113 and metal layers 150. Those skilled in the art will understand that additional layers that are not shown in FIGS. 2-11 may also be included between microlens 113 and metal layers 150. For example, additional optic layers (e.g. infrared filter) and/or oxide and metal grid layers may be included.

Figure 2:
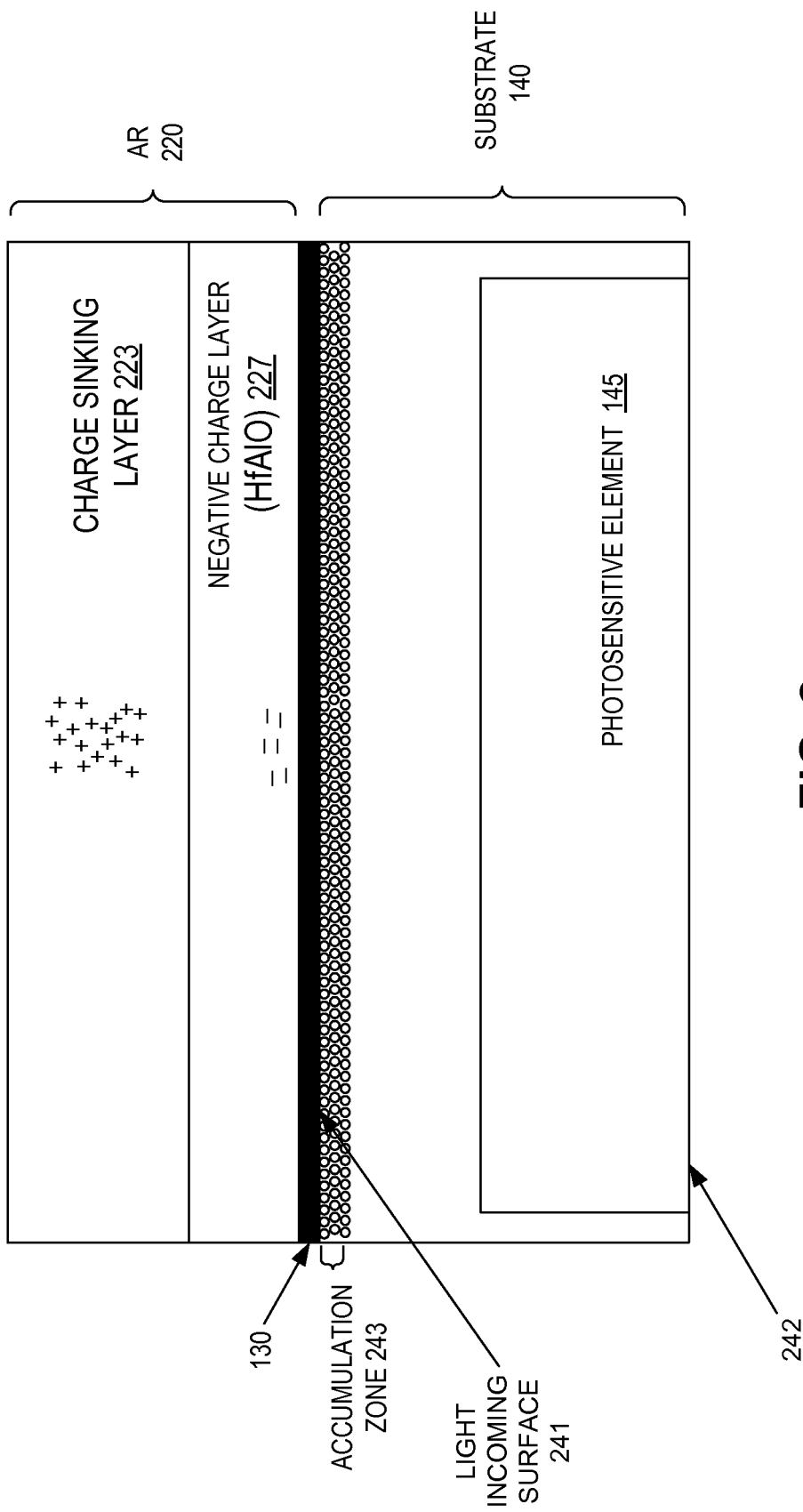
FIG. 2 illustrates example layers of a pixel of a backside illuminated image sensor having a negative charge layer and a charge sinking layer, in accordance with an embodiment of the disclosure.

FIG. 2 illustrates example layers of a pixel of a BSI image sensor having a negative charge layer, in accordance with an embodiment of the disclosure. Semiconductor substrate 140 includes a light-receiving surface 241. In the illustrated embodiment, light-receiving surface 241 is on the backside of semiconductor 140, as the illustrated layers are for a BSI image sensor. In other words, light-receiving surface 241 receives image light 105 before the frontside surface 242 of semiconductor substrate 140, which is the surface opposite of light-receiving surface 241 in FIG. 2.

In FIG. 2, the negative charge layer 227 is made out of hafnium-aluminum-oxide ($HfAl_xO_y$). In some examples, there may be small amounts of other elements in the negative charge layer, but in those examples, the negative charge layer will still be primarily hafnium-aluminum-oxide. Hafnium-aluminum-oxide is inherently a negatively charged substance. As shown in FIG. 2, insulation layer 130 (which may be silicon-dioxide) provides a thin layer between negative charge layer 227 and semiconductor substrate 140. However, since hafnium-aluminum-oxide is inherently a negatively charged substance, its proximity to substrate 140 (being disposed along light-receiving surface 241) induces holes to form in an accumulation zone 243 near the light-receiving surface 241. Charge sinking layer 223 may be made from Tantalum-oxide (e.g. $Ta_2O_5$), which is an inherently positively charged substance that holds the negative charge in the negative charge layer 227 in place, which in turn can hold the holes in accumulation zone 243 in place. The accumulated holes in accumulation zone 243 reduce dark current that may be generated as a result of the interface between semiconductor substrate 140 and insulation layer 130 from becoming part of the image signal generated by photosensitive element 145. Consequently, the performance of the BSI image sensor is enhanced.

In conventional BSI image sensors, various two element metal oxides have been used as a negative charge layer proximate to the semiconductor substrate. For example, hafnium-oxide (HfO2), titanium-oxide (TiO2), zirconium-oxide (ZrO2), tantalum-oxide (Ta2O5), and aluminum oxide (Al2O3) have been used as negative charge layers. However, Applicants propose using a hafnium-aluminum-oxide as a negative charge layer. Applicants' experimentation and data analysis indicate that the properties of hafnium-aluminum-oxide offer improved performance over conventional negative charge layers. Unexpectedly, experiments indicate that hafnium-aluminum-oxide provides more stabilized (over time) negative fixed charge than conventional metal oxides used in negative charge layers. In addition, Applicants' data shows that hafnium-aluminum-oxide induces a higher density of holes in accumulation zone 243, which reduces dark current more proficiently than conventional negative charge layers. This hole inducing property of hafnium-aluminum-oxide may be derived from hafnium-aluminum-oxide's ability to retain and hold more negative charge than conventional negative charge layers, given the same thickness. Furthermore, since the optical properties of the negative charge layer are also important to configuring anti-reflection element 220, being able to induce a greater hole density in accumulation zone 243 may allow the negative charge layer 227 to have a smaller thickness than conventional solutions.

Figure 3:
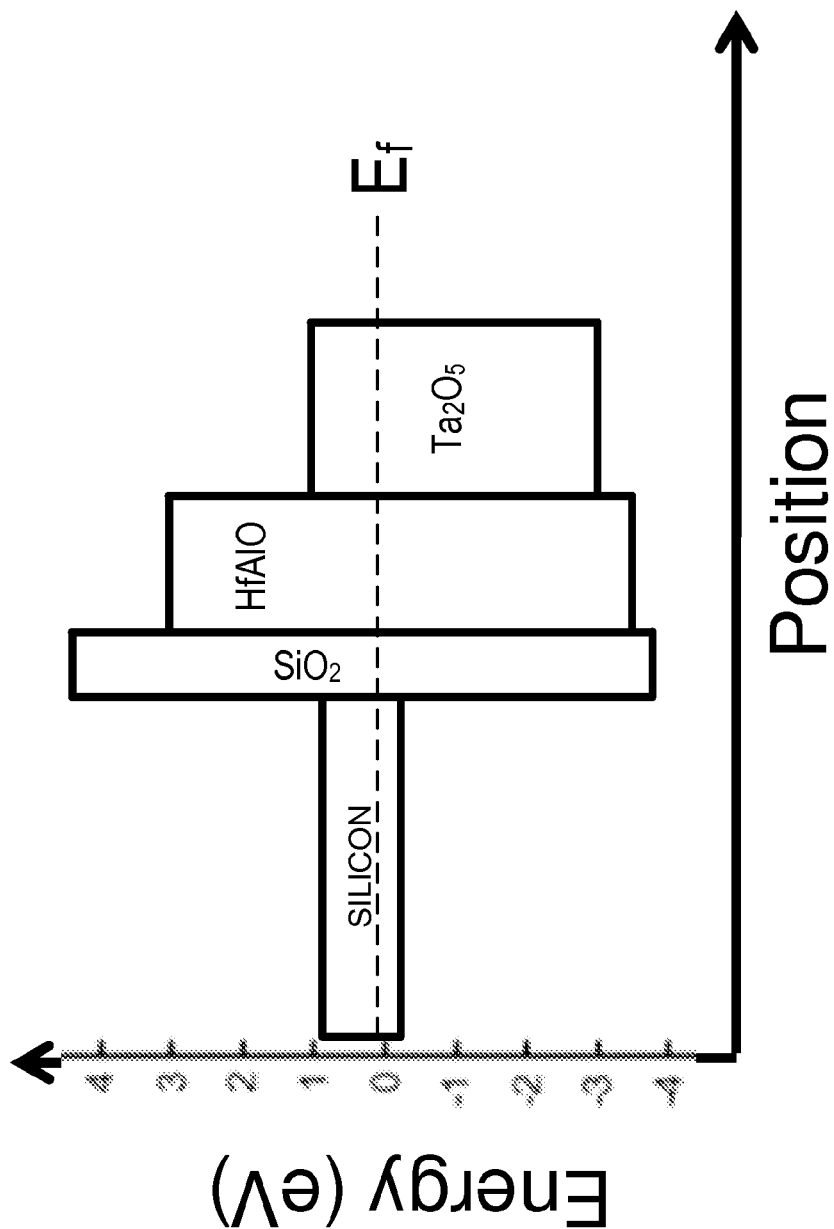
FIG. 3 shows a chart illustrating the position of layers in a pixel in relation to the energy required for electrons to transfer between the layers of FIG. 2, in accordance with an embodiment of the disclosure.

FIG. 3 shows a chart illustrating the position of layers in a pixel in relation to the energy required for electrons to transfer between the layers of FIG. 2, in accordance with an embodiment of the disclosure. FIG. 3 shows that a silicon-oxide layer is disposed between a silicon layer and a hafnium-aluminum-oxide layer. And, the hafnium-aluminum-oxide is disposed between the silicon oxide layer and the Tantalum-oxide layer. The illustrated silicon layer is an example of a substrate layer, the silicon-oxide layer is an example of an insulator layer, the hafnium-aluminum-oxide layer is an example of a negative charge layer, and the Tantalum-oxide layer is an example of a charge sinking layer.

Figure 4:
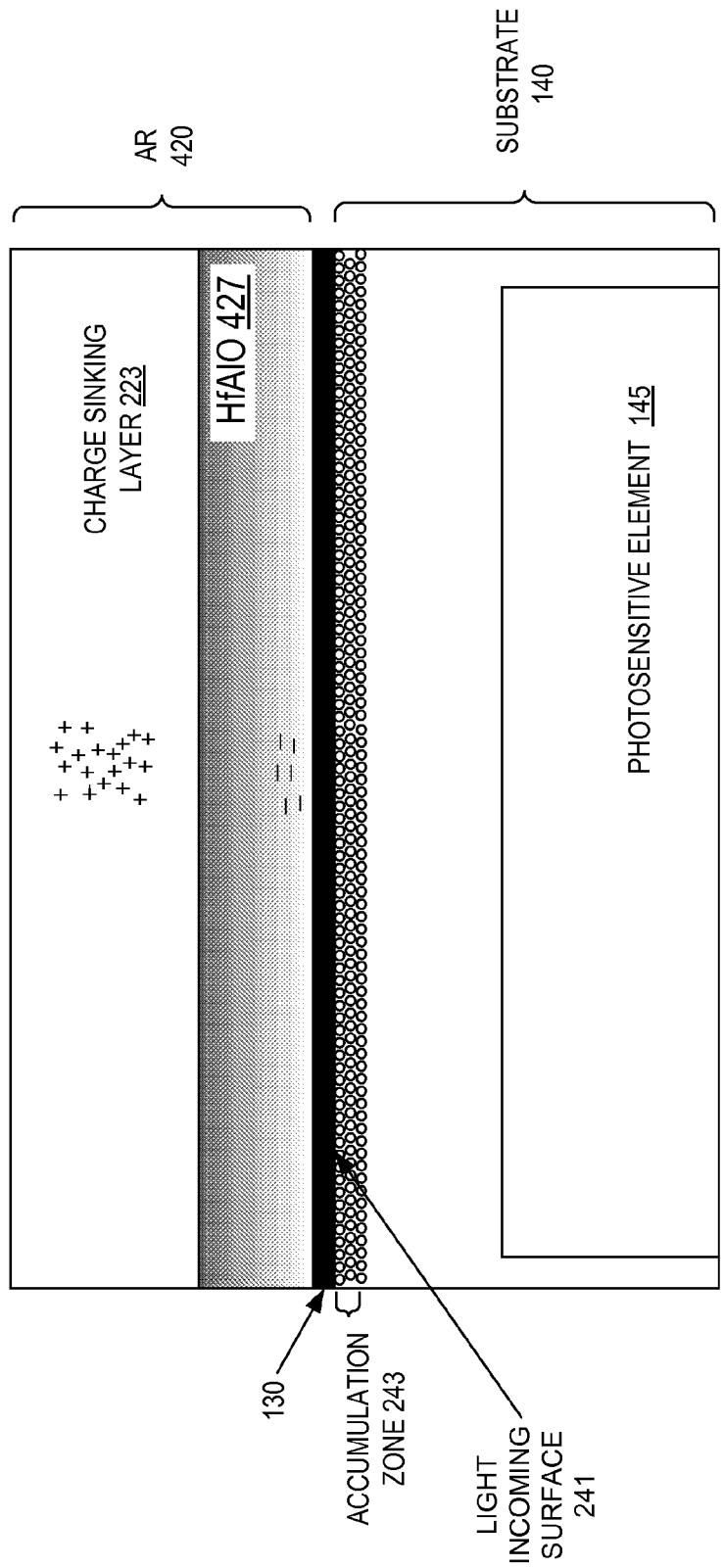
FIG. 4 illustrates example layers of a pixel of a backside illuminated image sensor having a graded negative charge layer and a charge sinking layer, in accordance with an embodiment of the disclosure.

FIG. 4 illustrates example layers of a pixel of a backside illuminated image sensor having a graded negative charge layer, in accordance with an embodiment of the disclosure. The embodiment illustrated in FIG. 4 differs from the embodiment illustrated in FIG. 2 because the negative charge layer 427 has a graded distribution of aluminum in the hafnium-aluminum-oxide. More specifically, there is a greater distribution of aluminum proximate to the top side (closest to charge sinking layer 223) of the negative charge layer 427 than to a bottom side (closest to insulation layer 130) of the negative charge layer 427. In contrast, negative charge layer 227 illustrated in FIG. 2 has substantially uniform distribution of aluminum in the hafnium-aluminum-oxide.

Figure 5:
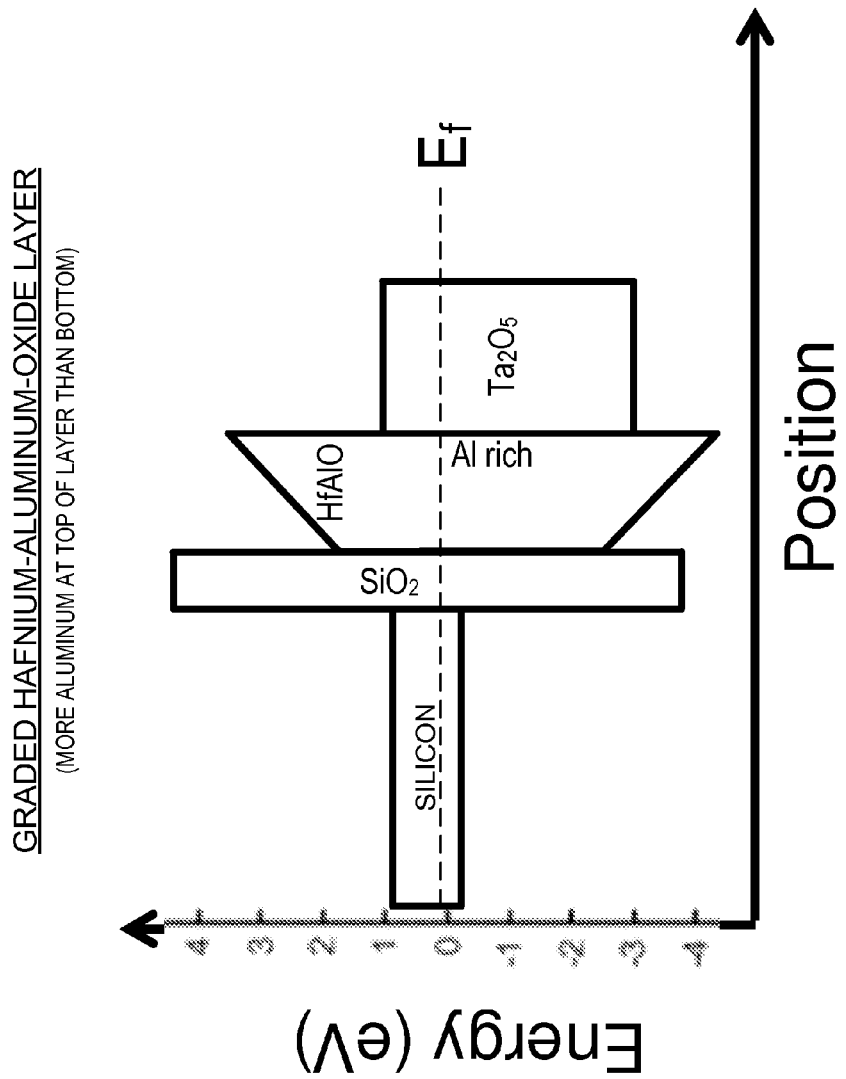
FIG. 5 shows a chart illustrating the position of layers in a pixel in relation to the energy required for electrons to transfer between the layers of FIG. 4, in accordance with an embodiment of the disclosure.

FIG. 5 shows a chart illustrating the position of layers in a pixel in relation to the energy required for electrons to transfer between the layers of FIG. 4, in accordance with an embodiment of the disclosure. The chart of FIG. 5 differs from the chart of FIG. 3 in that the hafnium-aluminum-oxide layer is tapered as it gets closer in position to the silicon layer. This shows that as a negatively charged carrier retained by negative charge layer 427 gets closer to the charge sinking layer (e.g. $Ta_2O_5$), it should require a higher amount of energy to transfer to the charge sinking layer. This is because the hafnium-aluminum-oxide layer gets richer in aluminum as it gets closer to the charge sinking layer, and the increased aluminum content provides a better barrier to negatively charged carriers that could potentially combine with positively charge carriers in the charge sinking layer (illustrated as $Ta_2O_5$). Therefore, having a graded negatively charged layer can reduce the amount of recombination interaction between the negatively charged layer and the positively charged layer. Consequently, the negatively charged layer will be better able to retain its negative charge to induce holes in accumulation zone 243.

To manufacture the graded negative charge layer illustrated in FIGS. 4 and 5, an atomic layer deposition ("ALD") process can be used to lay down sub-layers of hafnium-aluminum-oxide. After the insulation layer 130 is formed, one or more initial sub-layers of hafnium-aluminum-oxide may be deposited on insulation layer 130 using ALD. The initial sub-layers will form hafnium-aluminum-oxide with a first concentration/distribution of aluminum. Subsequently deposited sub-layers of hafnium-aluminum-oxide will have a concentration/distribution of aluminum that is greater than the initial sub-layers, which forms the graded distribution of aluminum. The grading of the distribution of aluminum in the hafnium-aluminum-oxide layer may be gradual (as illustrated by the smooth taper of HfAlO in FIG. 5) or may be more abrupt or stair stepped. Of course, to manufacture the negative charge layer illustrated in FIGS. 2 and 3, the concentration/distribution of aluminum in the hafnium-aluminum-oxide can be substantially the same as each sub-layer is formed using ALD.

Figure 6:
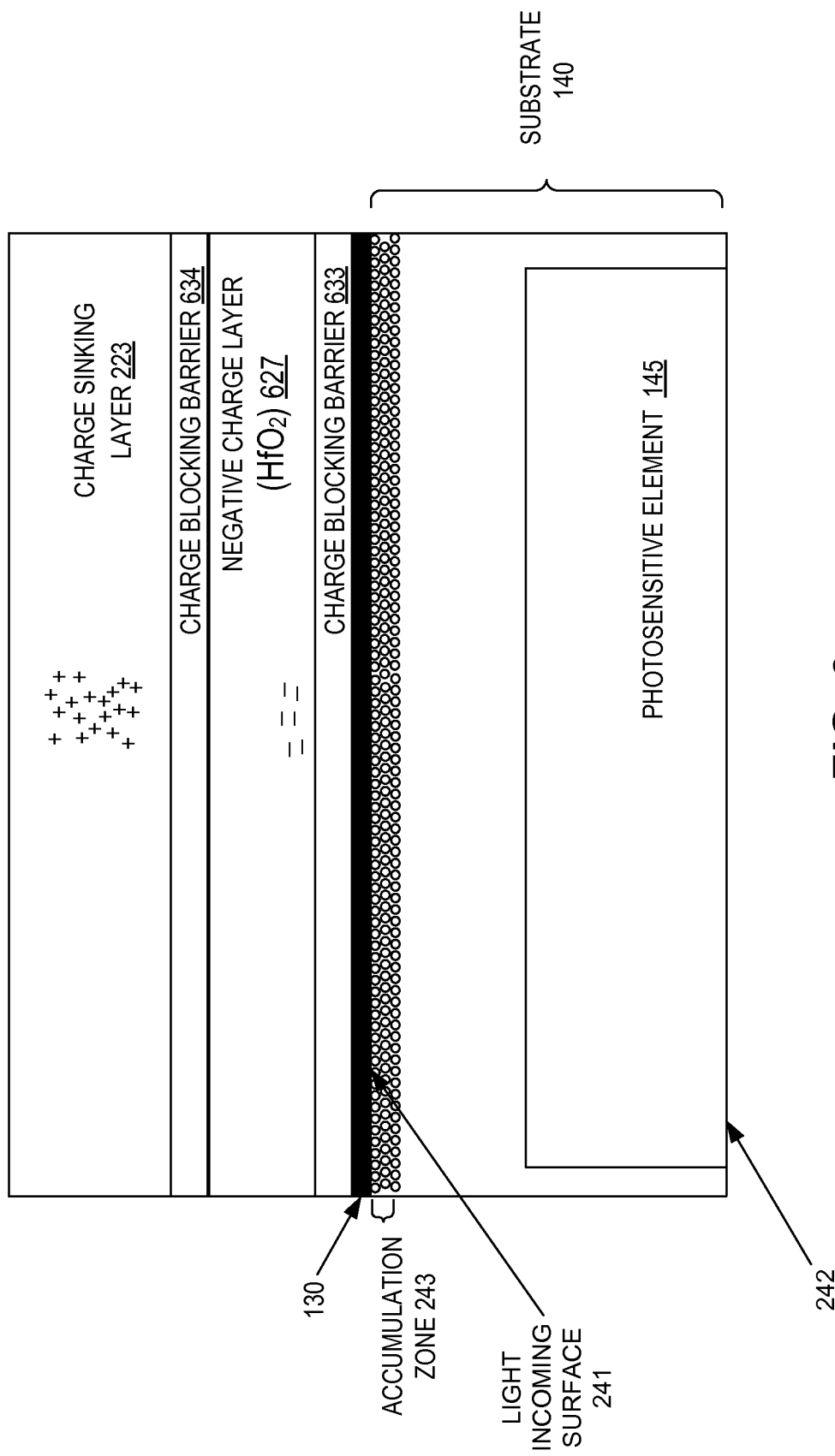
FIG. 6 illustrates example layers of a pixel of a backside illuminated image sensor having a negative charge layer and a charge sinking layer, in accordance with an embodiment of the disclosure.

FIG. 6 illustrates example layers of a pixel of a backside illuminated image sensor having a negative charge layer and a charge sinking layer, in accordance with an embodiment of the disclosure. In FIG. 6, a first charge blocking barrier layer 633 is disposed between insulator 130 and negative charge layer 627 and a second charging blocking layer 634 is disposed between charge sinking layer 223 and negative charge layer 627. Charge blocking barrier layers 633 and 634 may be made from aluminum-oxide ($Al_2O_3$). In one embodiment, one or more of charge blocking barrier layer 633 and 634 is made from hafnium-aluminum-oxide having an increased aluminum concentration. Charge blocking barriers 633 and 634 block electron migration between layers 223, 627, and substrate 140, which helps maintain the desired electrical charge of the layers. In FIG. 6, negative charge layer 627 is illustrated as including $HfO_2$, but in some embodiments, negative charge layer 627 may be made from hafnium-aluminum-oxide having a decreased aluminum concentration.

Figure 7:
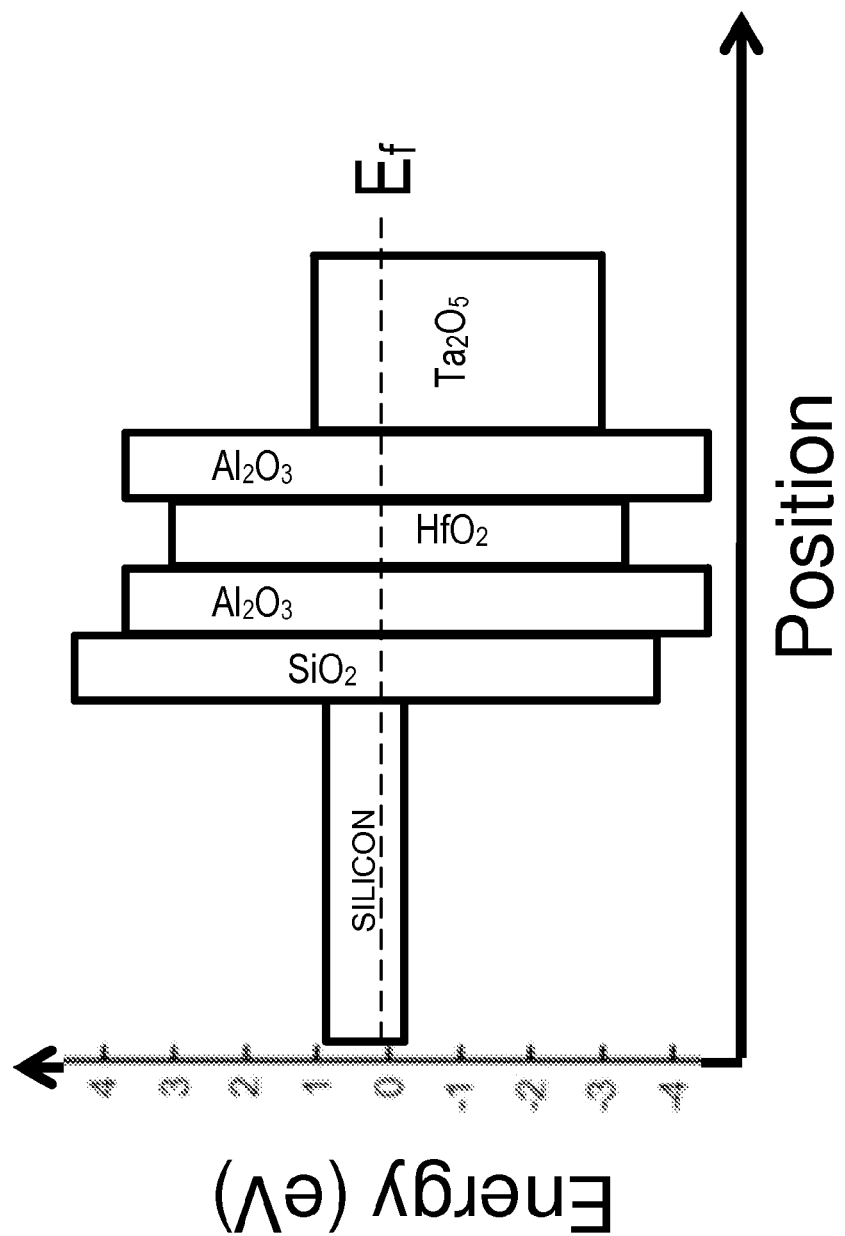
FIG. 7 shows a chart illustrating the position of layers in a pixel in relation to the energy required for electrons to transfer between the layers of FIG. 6, in accordance with an embodiment of the disclosure.

FIG. 7 shows a chart illustrating the position of layers in a pixel in relation to the energy required for electrons to transfer between the layers of FIG. 6, in accordance with an embodiment of the disclosure. FIG. 7 shows layers from left to right as a silicon layer (substrate), silicon-oxide layer (insulation layer), aluminum-oxide (charge blocking barrier), hafnium-oxide layer (example of negative charge layer), aluminum-oxide (charge blocking barrier), and tantalum-oxide layer (example of a charge sinking layer).

Figure 8:
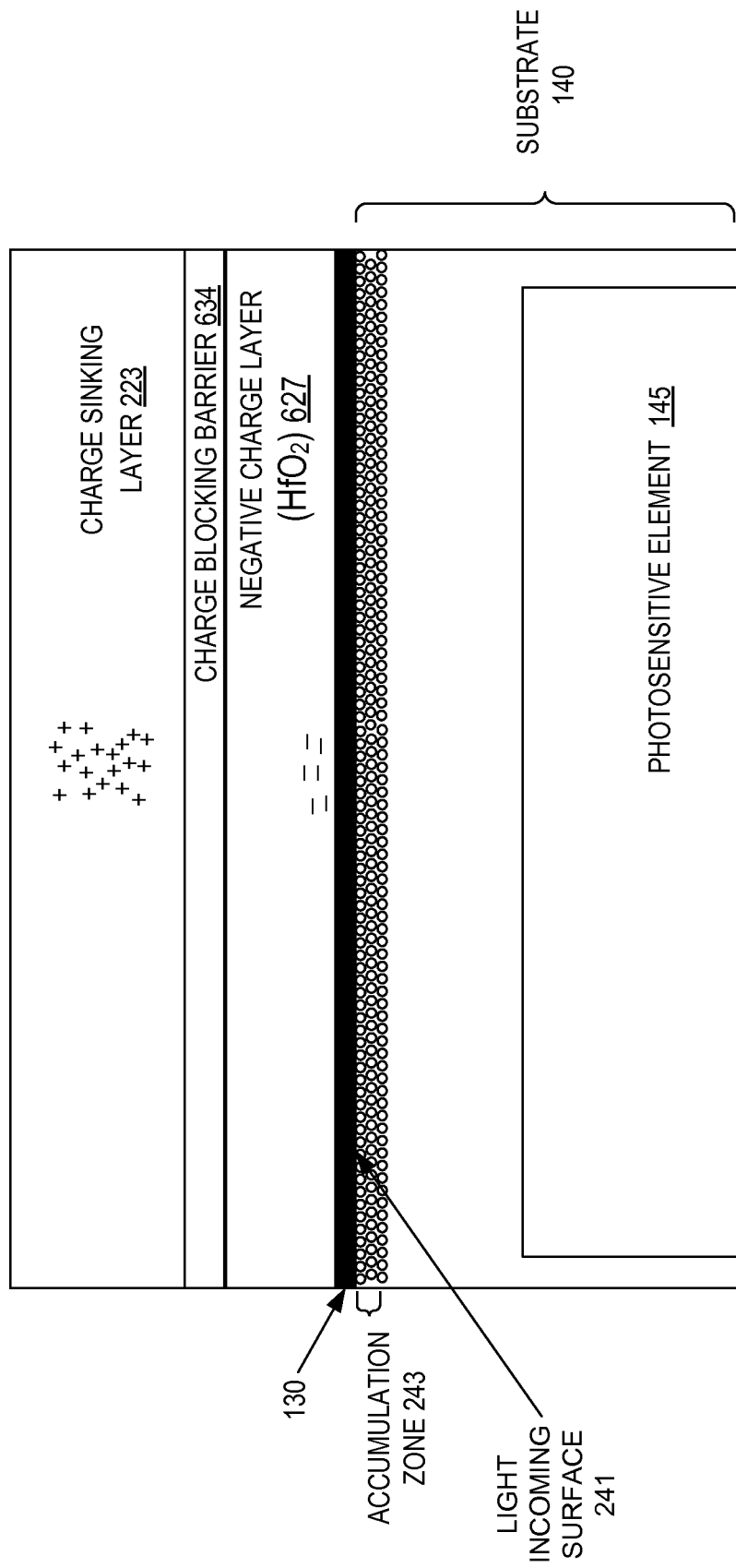
FIG. 8 illustrates example layers of a pixel of a backside illuminated image sensor having a negative charge layer and a charge sinking layer, in accordance with an embodiment of the disclosure.

FIG. 8 illustrates example layers of a pixel of a backside illuminated image sensor having a negative charge layer and a charge sinking layer, in accordance with an embodiment of the disclosure. In FIG. 8, a charge blocking barrier layer 634 is disposed between charge sinking layer 223 and negative charge layer 627. Charge blocking barrier layer 634 may be made from aluminum-oxide ($Al_2O_3$). In one embodiment, charge blocking barrier layer 634 is made from hafnium-aluminum-oxide having a high aluminum concentration. Charge blocking barrier 634 blocks electron migration between layers 223 and 627, which helps maintain the desired electrical charge of the layers. In FIG. 8, negative charge layer 627 is illustrated as including $HfO_2$, but in some embodiments, negative charge layer 627 may be made from hafnium-aluminum-oxide having a low aluminum concentration.

Figure 9:
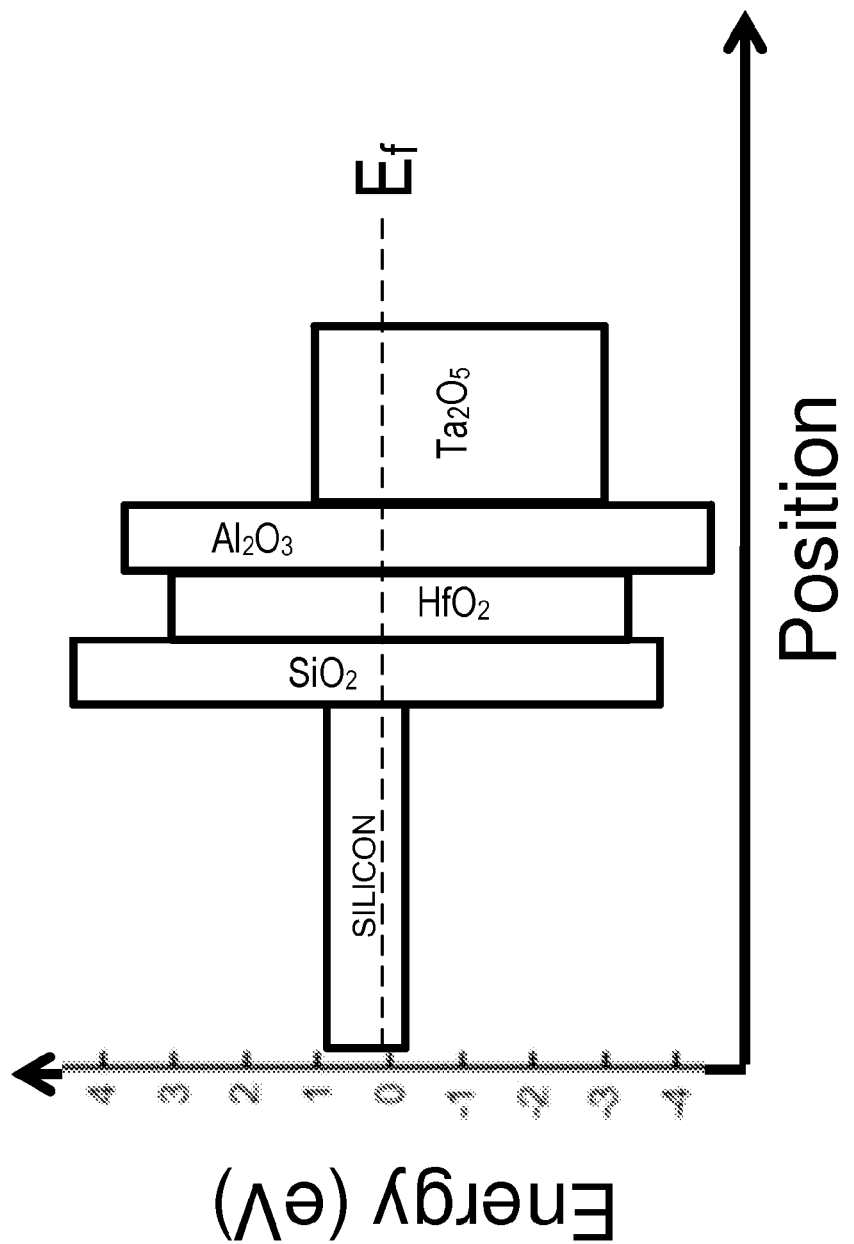
FIG. 9 shows a chart illustrating the position of layers in a pixel in relation to the energy required for electrons to transfer between the layers of FIG. 8, in accordance with an embodiment of the disclosure.

FIG. 9 shows a chart illustrating the position of layers in a pixel in relation to the energy required for electrons to transfer between the layers of FIG. 8, in accordance with an embodiment of the disclosure. FIG. 9 shows layers from left to right as a silicon layer (substrate), silicon-oxide layer (insulation layer), hafnium-oxide layer (example of negative charge layer), aluminum-oxide (charge blocking barrier), and tantalum-oxide layer (example of a charge sinking layer).

Figure 10:
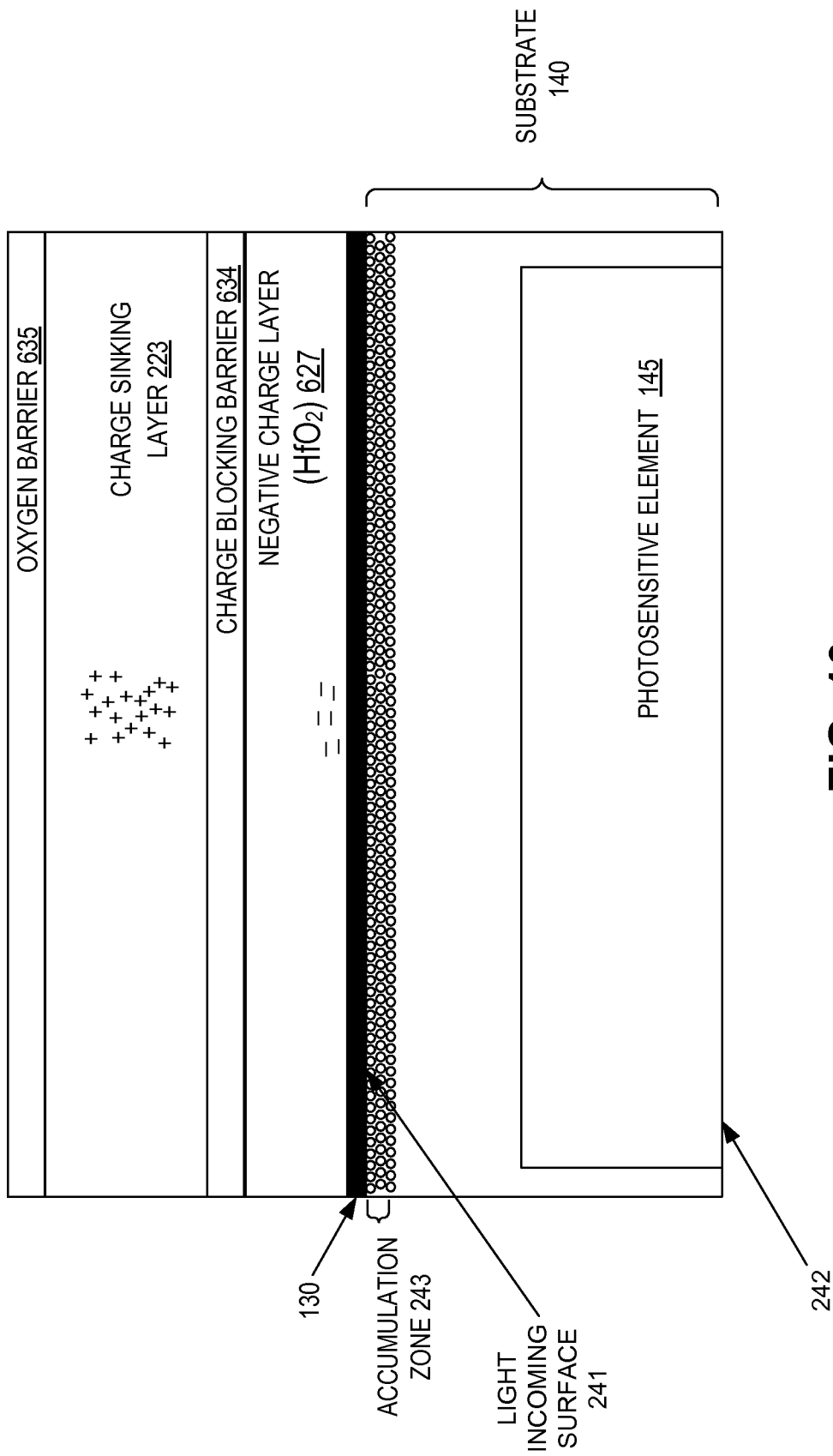
FIG. 10 illustrates example layers of a pixel of a backside illuminated image sensor having a negative charge layer and a charge sinking layer, in accordance with an embodiment of the disclosure.

FIG. 10 illustrates example layers of a pixel of a backside illuminated image sensor having a negative charge layer and a charge sinking layer, in accordance with an embodiment of the disclosure. In FIG. 10, a charge blocking barrier layer 634 is disposed between charge sinking layer 223 and negative charge layer 627. Charge blocking barrier layer 634 may be made from aluminum-oxide ($Al_2O_3$). In one embodiment, charge blocking barrier layer 634 is made from hafnium-aluminum-oxide having a high aluminum concentration. Charge blocking barrier 634 blocks electron migration between layers 223 and 627, which helps maintain the desired electrical charge of the layers. In FIG. 10, negative charge layer 627 is illustrated as including $HfO_2$, but in some embodiments, negative charge layer 627 may be made from hafnium-aluminum-oxide having a low aluminum concentration. Also included in FIG. 10 is an oxygen barrier layer 635. Oxygen barrier layer 635 may be made from aluminum-oxide ($AL_2O_3$), which has a low diffusion coefficient of oxygen that decreases oxygen diffusing into charge sinking layer 223. Oxygen diffusion into charge sinking layer 223 can detrimentally influence the desired electrical charge of the charge sinking layer, which is why it may be desirable to prevent oxygen diffusion into it.

Figure 11:
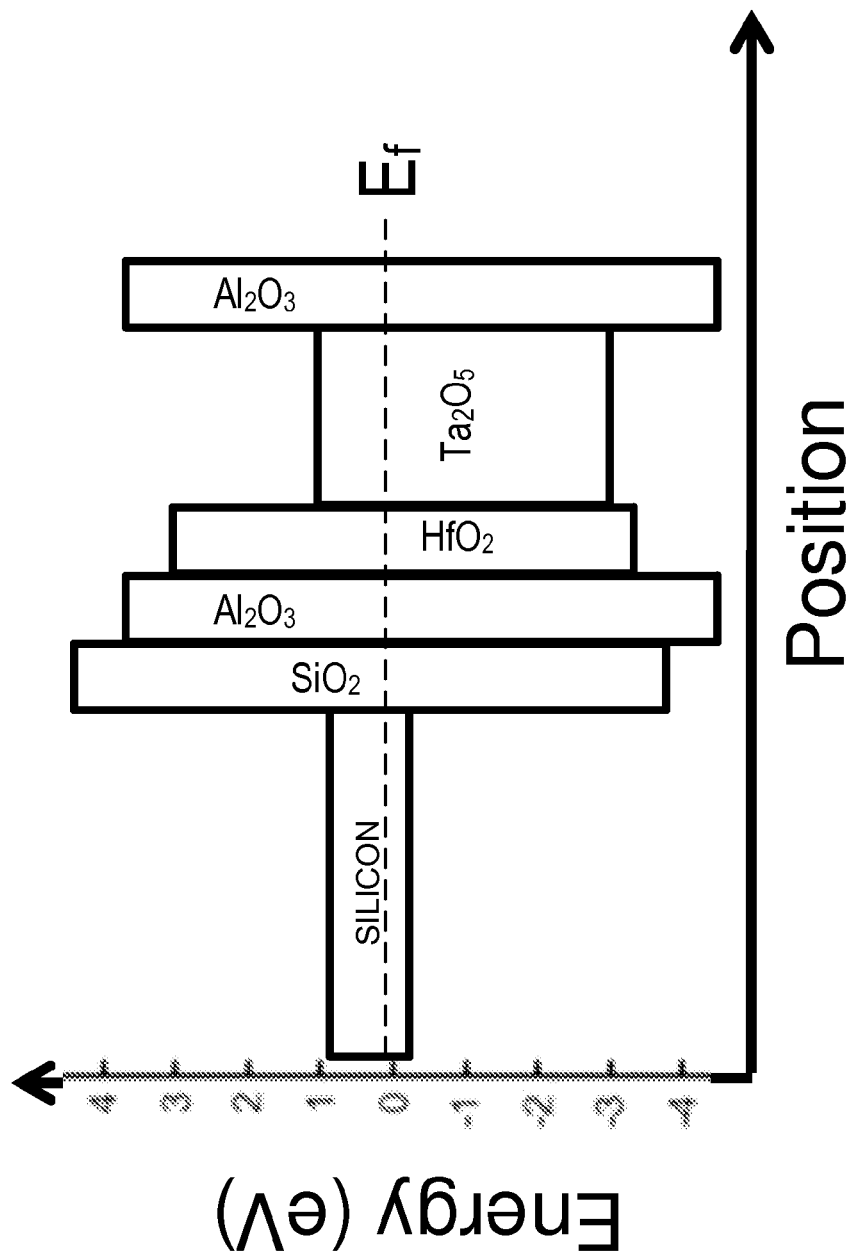
FIG. 11 shows a chart illustrating the position of layers in a pixel in relation to the energy required for electrons to transfer between the layers of FIG. 10, in accordance with an embodiment of the disclosure.

FIG. 11 shows a chart illustrating the position of layers in a pixel in relation to the energy required for electrons to transfer between the layers of FIG. 10, in accordance with an embodiment of the disclosure. FIG. 11 shows layers from left to right as a silicon layer (substrate), silicon-oxide layer (insulation layer), aluminum-oxide (charge blocking barrier), hafnium-oxide layer (example of negative charge layer), tantalum-oxide layer (example of a charge sinking layer), and aluminum-oxide (example of oxygen barrier layer).

With regard to the embodiments associated with FIGS. 6-11, in some cases, the charge sinking layer may actually supply electrons to the negative charge layer. This may happen if the charge sinking layer includes $SI_3N_4$ (instead of $Ta_2O_5$) and the negative charge layer includes $HfO_2$.

Figure 12:
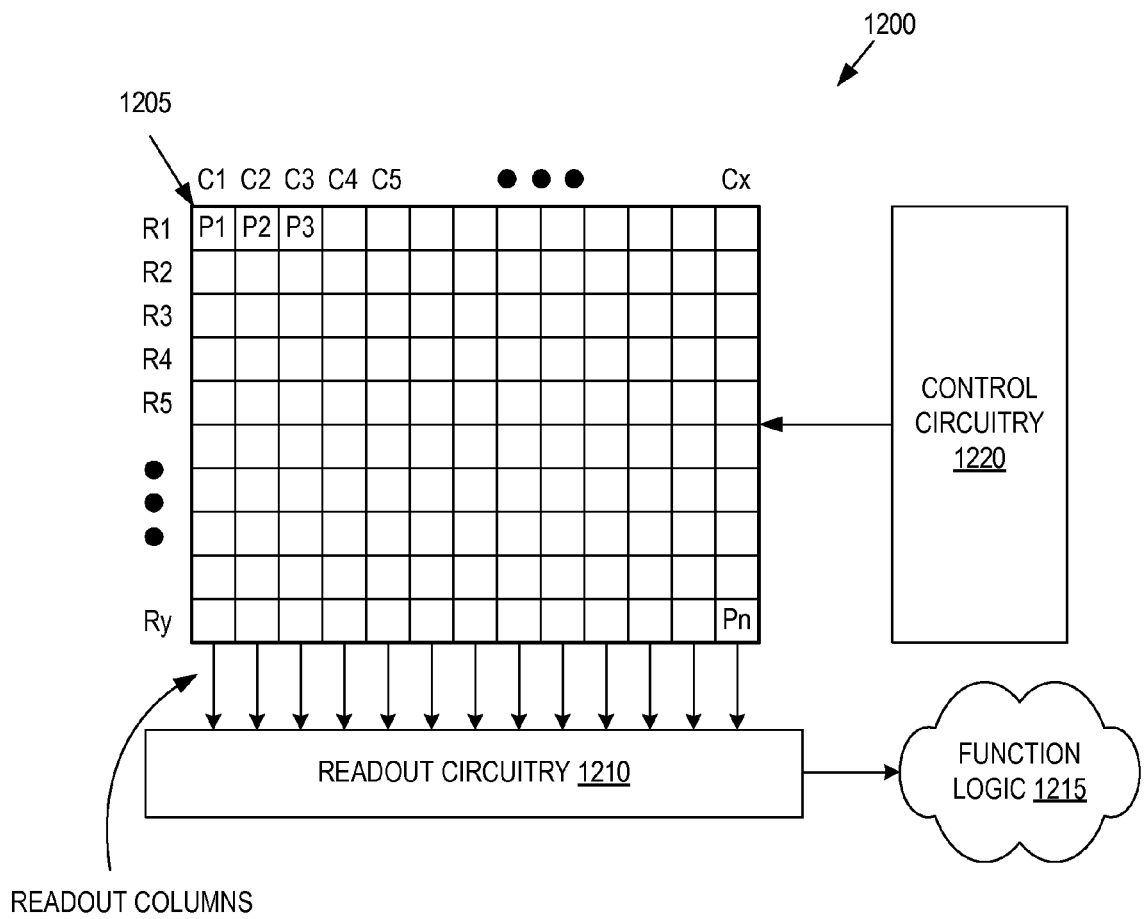
FIG. 12 is a block diagram illustrating an imaging system, in accordance with an embodiment of the disclosure.

FIG. 12 is a block diagram illustrating an imaging system 1200, in accordance with an embodiment of the disclosure. The illustrated embodiment of imaging system 1200 includes a pixel array 1205, readout circuitry 1210, function logic 1215, and control circuitry 1220.

Pixel array 1205 is a two-dimensional ("2D") array of imaging sensors or pixels (e.g., pixels P1, P2 . . . , Pn). In one embodiment, each pixel is a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object. Pixel 100 and the embodiments associated with FIGS. 1-5 may be incorporated into the pixels of pixel array 1205.

After each pixel has acquired its image data or image charge, the image data is readout by readout circuitry 1210 and transferred to function logic 1215. Readout circuitry 1210 may include amplification circuitry, analog-to-digital ("ADC") conversion circuitry, or otherwise. Function logic 1215 may simply store the image data or even manipulate the image data by applying post image effects (e.g., crop, rotate, remove red eye, adjust brightness, adjust contrast, or otherwise). In one embodiment, readout circuitry 1210 may readout a row of image data at a time along readout column lines (illustrated) or may readout the image data using a variety of other techniques (not illustrated), such as a serial readout or a full parallel readout of all pixels simultaneously. Control circuitry 1220 is coupled to pixel array 1205 to control operational characteristic of pixel array 1205. For example, control circuitry 1220 may generate a shutter signal for controlling image acquisition.

Figure 13:
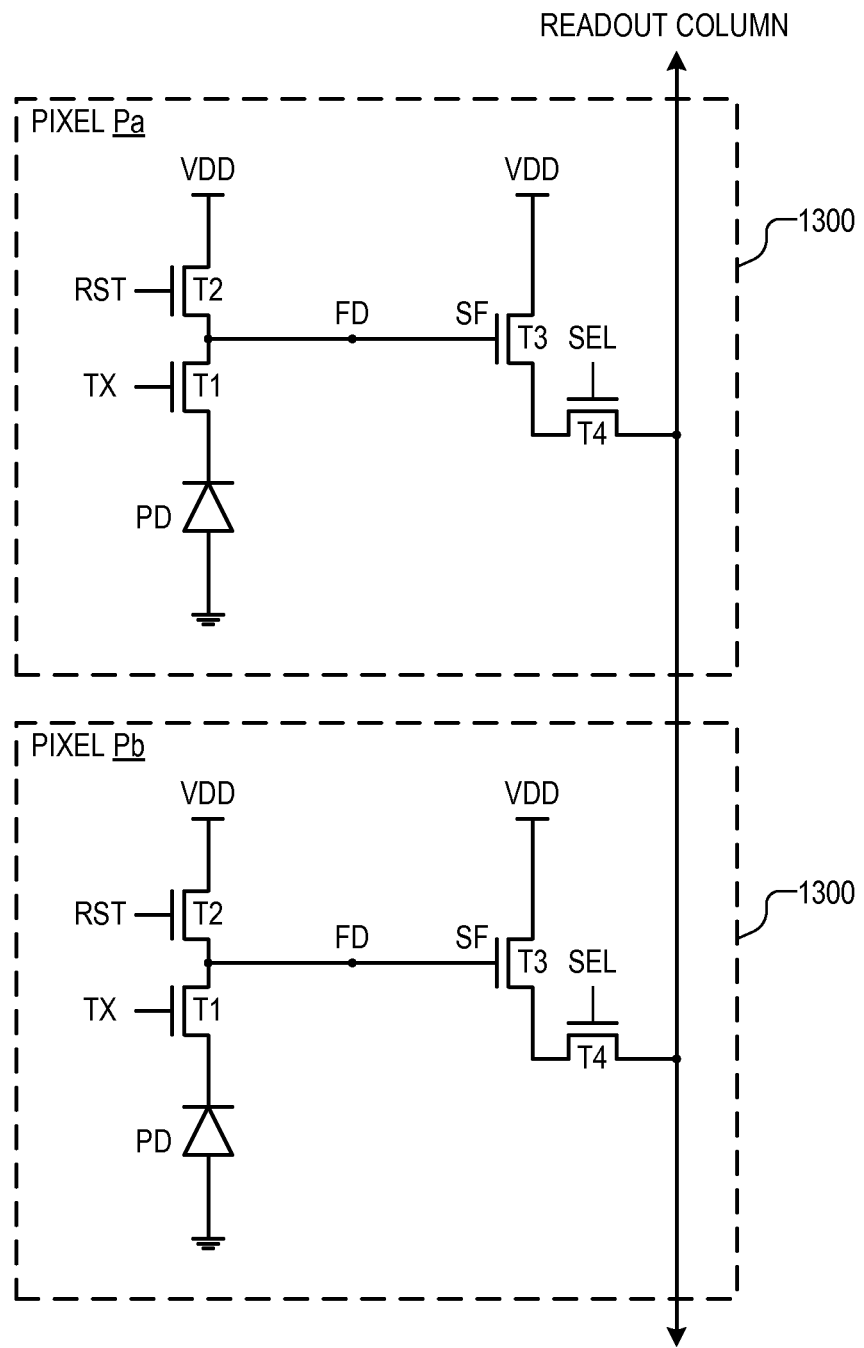
FIG. 13 is a circuit diagram illustrating pixel circuitry of two four-transistor ("4T") pixels within an imaging array, in accordance with an embodiment of the disclosure.

FIG. 13 is a circuit diagram illustrating pixel circuitry 1300 of two four-transistor ("4T") pixels within an imaging array, in accordance with an embodiment of the disclosure. Pixel circuitry 1300 is one possible pixel circuitry architecture for implementing each pixel within pixel array 1205 of FIG. 12. However, it should be appreciated that embodiments of the present disclosure are not limited to 4T pixel architectures; rather, one of ordinary skill in the art having the benefit of the instant disclosure will understand that the present teachings are also applicable to 3T designs, 5T designs, and various other pixel architectures.

In FIG. 13, pixels Pa and Pb are arranged in two rows and one column. The illustrated embodiment of each pixel circuitry 1300 includes a photodiode PD, a transfer transistor T1, a reset transistor T2, a source-follower ("SF") transistor T3, a select transistor T4, and a storage capacitor C1. During operation, transfer transistor T1 receives a transfer signal TX, which transfers the charge accumulated in photodiode PD to a floating diffusion node FD. In one embodiment, floating diffusion node FD may be coupled to a storage capacitor for temporarily storing image charges.

Reset transistor T2 is coupled between a power rail VDD and the floating diffusion node FD to reset the pixel (e.g., discharge or charge the FD and the PD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance connection to the floating diffusion FD. Finally, select transistor T4 selectively couples the output of pixel circuitry 1300 to the readout column line under control of a select signal SEL. In one embodiment, the TX signal, the RST signal, and the SEL signal are generated by control circuitry 1220.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor comprising:
   a semiconductor substrate including a photosensitive element for accumulating charge in response to incident image light, wherein the semiconductor substrate includes a light-receiving surface positioned to receive the image light;
   a negative charge layer disposed proximate to the light-receiving surface of the semiconductor substrate to induce holes in an accumulation zone in the semiconductor substrate along the light-receiving surface; and
   a charge sinking layer disposed proximate to the negative charge layer and retaining positive fixed electric charge for sinking positive charge from the negative charge layer, wherein the negative charge layer is disposed between the semiconductor substrate and the charge sinking layer, wherein the negative charge layer includes hafnium-aluminum-oxide, wherein the negative charge layer includes a graded distribution of aluminum in the hafnium-aluminum-oxide, the hafnium-aluminum-oxide including a greater distribution of aluminum proximate to a top side of the negative charge layer than proximate to a bottom side of the negative charge layer, the bottom side in closer proximity to the photosensitive element than the top side.

2. The image sensor of claim 1, wherein the graded distribution is a gradual increase in the aluminum content.

3. The image sensor of claim 1, wherein the graded distribution is a step-wise increase in the aluminum content.

4. The image sensor of claim 1, wherein a first thickness of the negative charge layer and a second thickness of the charge sinking layer are configured to reduce an amount of reflection of the image light.

5. An image sensor comprising:
   a semiconductor substrate including a photosensitive element for accumulating charge in response to incident image light, wherein the semiconductor substrate includes a light-receiving surface positioned to receive the image light;
   a negative charge layer disposed proximate to the light-receiving surface of the semiconductor substrate to induce holes in an accumulation zone in the semiconductor substrate along the light-receiving surface; and
   a charge sinking layer disposed proximate to the negative charge layer for supplying electrons from the charge sinking layer to the negative charge layer to conserve or increase an amount of negative charge in the negative charge layer, and wherein the negative charge layer is disposed between the semiconductor substrate and the charge sinking layer, wherein the negative charge layer includes hafnium-aluminum-oxide, wherein the negative charge layer includes a graded distribution of aluminum in the hafnium-aluminum-oxide, the hafnium-aluminum-oxide including a greater distribution of aluminum proximate to a top side of the negative charge layer than proximate to a bottom side of the negative charge layer, the bottom side in closer proximity to the photosensitive element than the top side.

* * * * *